United States Patent
Kerr et al.

(10) Patent No.: US 8,361,840 B2
(45) Date of Patent: Jan. 29, 2013

(54) THERMAL BARRIER LAYER FOR INTEGRATED CIRCUIT MANUFACTURE

(75) Inventors: Roger S. Kerr, Brockport, NY (US); Timothy J. Tredwell, Fairport, NY (US); Seung-Ho Baek, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 1131 days.

(21) Appl. No.: 12/236,907

(22) Filed: Sep. 24, 2008

(65) Prior Publication Data
US 2010/0075459 A1   Mar. 25, 2010

(51) Int. Cl.
*H01L 21/50* (2006.01)
*H01L 21/48* (2006.01)
*H01L 21/44* (2006.01)

(52) U.S. Cl. ........ 438/112; 438/108; 438/110; 438/126; 438/127; 438/455

(58) Field of Classification Search ................ None
See application file for complete search history.

(56) References Cited

U.S. PATENT DOCUMENTS

| | | | |
|---|---|---|---|
| 3,655,496 A | 4/1972 | Ettre et al. | |
| 4,571,826 A | 2/1986 | Jacobs | |
| 5,833,073 A | 11/1998 | Schatz et al. | |
| 6,029,427 A | 2/2000 | Freund et al. | |
| 6,034,441 A * | 3/2000 | Chen | 257/787 |
| 6,071,755 A * | 6/2000 | Baba et al. | 438/106 |
| 6,696,347 B1 * | 2/2004 | Hikita et al. | 438/406 |
| 6,906,403 B2 * | 6/2005 | Bolken et al. | 257/678 |
| 7,195,733 B2 | 3/2007 | Rogers et al. | |
| 7,931,063 B2 * | 4/2011 | Craig et al. | 156/379.6 |
| 8,123,896 B2 * | 2/2012 | Watanabe et al. | 156/300 |
| 2004/0020036 A1 | 2/2004 | Arneson et al. | |
| 2005/0005434 A1 | 1/2005 | Arneson et al. | |
| 2005/0199584 A1 | 9/2005 | Nuzzo et al. | |

(Continued)

FOREIGN PATENT DOCUMENTS

EP   1 594 351 A2   11/2005
JP   02 264444 A    10/1990

(Continued)

OTHER PUBLICATIONS

Ouellette, Jennifer, "Exploiting Molecular Self-Assembly," 28 The Industrial Physicist, American Institute of Physics, Dec. 2000, 3 Pages.

(Continued)

*Primary Examiner* — Zandra Smith
*Assistant Examiner* — Khanh Duong
(74) *Attorney, Agent, or Firm* — Nelson Adrian Blish

(57) ABSTRACT

Exemplary embodiments provide methods and systems for assembling electronic devices, such as integrated circuit (IC) chips, by selectively and scalably embedding or seating IC elements onto/into a receiving substrate, such as a chip substrate. Preparing of the chip substrate can be performed by depositing or patterning an activatable thermal barrier material on a surface of the substrate. The IC chips are secured on the prepared substrate by activating the thermal barrier material between the chip substrate and IC chips. Securing can include softening of the chip substrate with the activated thermal barrier material to an amount suitable for embedding the IC chips. Securing can also include adhesively bonding the IC chips to the substrate with the activated thermal barrier material in the case of a non-pliable substrate.

5 Claims, 8 Drawing Sheets

U.S. PATENT DOCUMENTS

2006/0084012 A1 4/2006 Nuzzo et al.
2007/0032089 A1 2/2007 Nuzzo et al.

FOREIGN PATENT DOCUMENTS

| WO | 2005122285 | 12/2005 |
| WO | WO 2007/023834 A1 | 3/2007 |
| WO | WO 2008/033680 A2 | 3/2008 |

OTHER PUBLICATIONS

Usami, Mitsuo et al., "Powder LSI: An Ultra Small RF Identification Chip for Individual Recognition Applications," 2003 IEEE International Solid-State Circuits Conference, IEEE/ISSCC 2003 Visuals Supplement, pp. 326, 327 and 579.

* cited by examiner

THERMAL BARRIER LAYER FOR INTEGRATED CIRCUIT MANUFACTURE

DESCRIPTION OF THE INVENTION

1. Field of the Invention

This invention relates generally to assembly of semiconductor devices and, more particularly, to the assembly of integrated circuit elements.

2. Background of the Invention

As market demand increases for integrated circuit (IC) products such as radio frequency identification (RFID) tags, and as IC die sizes shrink, high assembly throughput rates for very small die and low production costs are crucial in providing commercially-viable products. For example, the cost of an RFID device still depends on assembly complexity.

Conventional methods for assembling IC products include pick and place techniques. Such techniques involve a manipulator, such as a robot arm, to remove IC dies from a wafer and place them onto a die carrier or directly onto a substrate. The dies are ultimately mounted onto a substrate with other electronic components, such as antennas, capacitors, resistors, and inductors to form an electronic device. However, these techniques have drawbacks and disadvantages. For example, the pick and place techniques involve complex robotic components and control systems that handle only one die at a time. In addition, pick and place techniques have limited placement accuracy, and have a minimum die size requirement.

Thus, there is a need to overcome these and other problems of the prior art and to provide controllable methods for a scalable and low cost assembly in transferring and assembling electronic device elements with chip substrates.

SUMMARY OF THE INVENTION

In accordance with the present teachings, a method for assembling integrated circuits is provided.

The exemplary method can include providing a chip substrate for supporting one or more IC elements on a chip substrate; providing an activatable thermal barrier layer on the chip substrate; transferring one or more IC elements to the chip substrate, wherein the activatable thermal barrier material is provided between the one or more transferred IC elements and the chip substrate; and bonding each transferred IC element onto the chip substrate, wherein bonding each transferred IC element comprises activating the thermal barrier layer by applying an energy source to heat and activate the bonding function of the activatable thermal barrier layer to bond each transferred IC element onto the chip substrate.

In accordance with the present teachings, a method for assembling integrated circuits is provided.

The exemplary method can include selectively applying an activatable thermal barrier material on a chip substrate, the activatable thermal barrier material comprising an IR absorber; applying a thermal energy to the activatable thermal barrier material and thereby soften underlying portions of the chip substrate; positioning one or more IC elements that are attached to a release layer with respect to the chip substrate such that each IC element contacts a corresponding softened portion of the chip substrate; applying pressure to embed each IC element into the corresponding softened portion of the chip substrate; and removing the release layer.

In accordance with the present teachings, a system for integrated circuit assembly is provided.

The exemplary system can include a chip substrate supporting one or more transferred IC elements; an activatable thermal barrier layer formed on the chip substrate, wherein the activatable thermal barrier material is provided between the one or more IC elements and the chip substrate; and an energy source directed at said activatable thermal barrier layer, wherein said energy source activates said activatable thermal barrier layer and bonds each transferred IC element onto the chip substrate.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
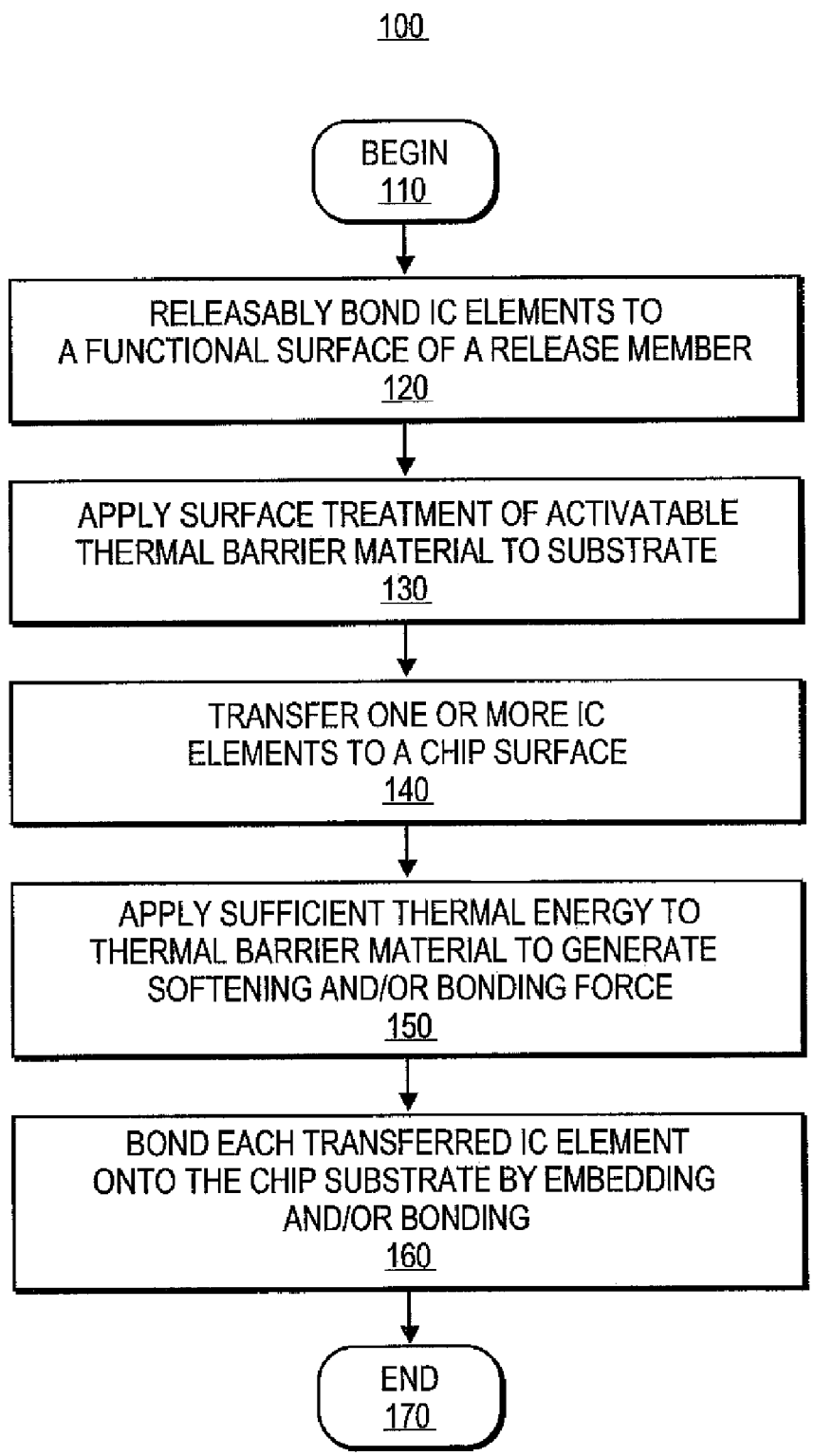
FIG. 1 depicts an exemplary method for assembly of IC elements onto a chip substrate in accordance with the present teachings.

Reference will now be made in detail to exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

Exemplary embodiments provide methods and systems for assembling electronic devices, such as integrated circuit (IC) chips. For example, IC elements/components can be selectively and scalably transferred from, for example an intermediate transfer layer, and assembled with a receiving material such as an intermediate substrate or a final chip substrate to form IC chips. Further, the receiving material can include a bonding layer and/or pattern thereon for receiving the IC elements/components. The bonding layer can be selectively applied to the receiving material corresponding to a desired arrangement of IC elements thereon. Even further, the bonding layer can be applied to a variety of receiving materials, including glass, paper, and plastic, for example, in sheet or roll form. As disclosed herein, exemplary IC elements can include, but are not limited to, display elements, detector elements, processor elements, or any other IC elements as would be understood by one of ordinary skill in the art.

For ease of illustration, the invention will be described with reference to an assembly of IC chips in an exemplary form of radio frequency identification (RFID) chips. RFID chips can be used in various applications, such as inventory control, airport baggage monitoring, as well as security and surveillance applications for location monitoring and real time tracking of such items. Generally, an RFID chip can include, e.g., a plurality of die elements (dies) mounted onto related supporting electronics that can be located on a chip substrate. The plurality of dies can be an integrated circuit that performs RFID operations known to one of ordinary skill in the art, such as communicating with one or more chip readers according to various interrogation protocols of RFID. Each die can further include conductive connections to electrically contact with the supporting electronics. The conductive connections of each die can include, for example, conductive traces, such as conductive ink traces, or conductive bumps or bumps attached to a strap.

Even further, it will be appreciated the placement of die on a surface can be such that the die are magnetically aligned prior to subsequent processing. An example of the magnetic alignment of the die is disclosed in, for example commonly owned published application number 2006-0131504, and incorporated herein by reference in its entirety.

When assembling RFID chips, the die can be mounted, for example, in either a "bump side up" or "bump side down" orientation. As used herein, the terms "bump side up" and "bump side down" denote alternative implementations of the plurality of dies. In particular, these terms designate the orientation of connection bumps in relation to a subsequent surface onto which the dies are to be transferred and assembled. That is, in a "bump side up" orientation, the plurality of dies can be transferred to the subsequent surface with bumps facing away from the subsequent surface. In a "bump side down" orientation, the plurality of dies can be transferred to the subsequent surface with bumps facing towards, and in contact with the subsequent surface. In various embodiments, the subsequent surface can be a receiving surface that includes, for example, an intermediate transfer surface, or an actual final chip substrate to which the dies can be permanently attached. In various embodiments, the subsequent surface can be rigid or flexible and can be formed of a material chosen from, for example, plastic, paper, glass, etc., for either the intermediate transfer surface or a final chip substrate.

As disclosed herein, the assembly of IC elements (e.g., the dies for RFID chips) can include releasably bonding the IC elements to a release layer, applying a surface treatment of activatable thermal barrier material to a receiving surface (e.g., intermediate transfer surface or a chip substrate surface), transferring the released IC elements onto the receiving surface, applying sufficient thermal energy to the surface treatment to activate bonding characteristics of the surface treatment, and bonding the IC elements with the activated receiving surface.

The "release layer" can be in a form of, for example, a web, a film, a plate, a roll, and their various combinations, to which the IC elements can be attached. The release layer can be a rigid release layer or a flexible release layer. As used herein, the term "flexible" refers to the ability of a material, structure, device or device component to be deformed into a curved shape without undergoing a transformation that introduces significant strain, such as strain characterizing the failure point of a material, structure, device, or device component. The release layer can therefore include, but is not limited to, a flexible web, flexible film, flexible plate, flexible roll, and their various combinations. In addition, the term "release layer" can provide a large releasing area, for example, about such as a 2-meter square releasing area or part of a substrate and as much as an entire web. Accordingly, a large area for transferring and receiving onto/into the receiving surface of an intermediate transfer surface or chip substrate can be selectively performed.

In various embodiments, the IC elements can be attached to the release layer through a functional surface formed on a release support. The functional surface can be adhesive to initially hold the attached IC elements in place and can further provide an easy release when necessary. For example, the functional surface can include an adhesive phase-change surface formed on the support surface of the release layer. In one example, the release layer can include a phase-change surface that provides an adhesive surface when the IC elements contact therewith and further provides a phase-change when exposed to an energy source such as a laser so as to vacate the adhesive properties. This phase change can be used to release the attached IC elements from the release layer and transfer the IC elements onto a receiving surface such as a further intermediate transfer surface or a chip substrate surface. In another example, the release layer can be a sticky tape such as a green tape or a blue tape known in the industry or can include an epoxy, glue, or wax applied on the support surface of the release layer to provide surface adhesiveness and further to provide easy removal of the attached IC elements.

The intermediate transfer surface or chip substrate can be rigid or flexible and can include a material including, for example, a paper, plastic, metal, glass, or similar material. The intermediate transfer surface or chip substrate can include a sheet and can include a roll. In another example, a sheet or roll of intermediate transfer surface or substrate can be printed with a surface treatment of the activatable thermal barrier layer in a predetermined pattern or as a continuous surface on the intermediate transfer surface or substrate.

The surface treatment of activatable thermal barrier material can include a thermal adhesive and can further include an infrared (IR) absorber in the thermal adhesive. When a laser or similar energy source is applied to the thermal barrier material, the IR absorber is activated and generates heat and thereby thermally activates the adhesive to generate a bonding force within the adhesive. The bonding force of the thermal adhesive can secure a placed IC chip on the intermediate transfer surface or chip substrate. As used herein, the term "activatable" refers to a state of the thermal adhesive having the IR absorber therein in which the IR absorber has not been targeted and hence the thermal adhesive has not yet been activated. As used herein, the term "activated" refers to a state of the thermal adhesive having the IR absorber targeted with an IR source and generating heat to activate the thermal adhesive. The activated thermal barrier layer can bond with any of the paper or plastic receiving surfaces and further accept the IC chip thus providing the bond between the receiving surface and the IC chip. In the case of a plastic receiving surface, the activatable thermal barrier material can soften the plastic upon receiving sufficient thermal energy to activate the IR absorber in the thermal adhesive. The transferred IC elements can then be embedded into the softened plastic and further adhered by the bonding force of the activated thermal adhesive.

As used herein, the term "activatable thermal barrier material" refers to a material that can be activated to generate a thermal energy (e.g., heat). The activatable thermal barrier material can include, but is not limited to, a thermal adhesive including an IR, UV, or microwave absorber therein. Based on the materials used, the IR absorber can be activated by being exposed to and absorbing a sufficient energy, such as an optical, electrical, magnetic, radiative energy or various energy combinations thereof using various energy sources. The absorber molecules dissipate the absorbed energy principally as heat, which raises an internal temperature of the thermal adhesive, thereby activating a bonding energy of the thermal adhesive. The absorbed energy can generate heat to activate the bonding state thereof as with a substrate of paper, and/or to soften a joining area with other materials, such as the underlying exemplary plastic chip substrate. In the case of a paper or glass substrate, the thermal adhesive acts as an adhesive bond upon activation. In the case of an exemplary plastic chip substrate, and depending on the power and exposing time of the energy applied, various portions of a plastic chip substrate can be softened or even ablated by the heated thermal adhesive. Other components, such as IC elements, can be pushed or placed in and assembled (e.g., embedded or seated) in the exemplary plastic chip substrate, the adhesive state of the activatable thermal barrier material securing the chip to the substrate.

As used herein, the term "plastic" refers to any synthetic or naturally occurring material or combination of materials that can be molded or shaped, generally when heated and hardened into a desire shape. Exemplary plastics useful in assembling IC chips can include, but are not limited to, polymers, resins and/or cellulose derivatives. In an additional example, the plastics useful in assembling IC chips can include polyester, polystyrene, ABS, acrylic, polycarbonate and PVC. The term "plastic" is further intended to include composite plastic materials including one or more plastics with one or more additives, such as structural enhancers, fillers, fibers, plasticizers, stabilizers, and/or additives which may provide desired chemical or physical properties. Other suitable materials can be used for the intermediate transfer surface or chip substrate including, but not limited to glass, metal, paper, or other similar fibrous or packaging material.

In various embodiments, the assembly of IC chips can include, for example, depositing IC elements onto a release layer having a functional surface thereon. The functional surface can include a phase change material, which when receiving an optical source, can undergo a phase-change to release the die initially bonded thereto. In various embodiments, the assembly of IC chips can include, for example, depositing IC elements from the release layer onto a receiving surface which can accommodate the IC elements thereon and therein. For example, the preparation of the intermediate transfer surface or the final chip substrate can be performed by using, for example, an activatable thermal barrier material.

Figure 2A:
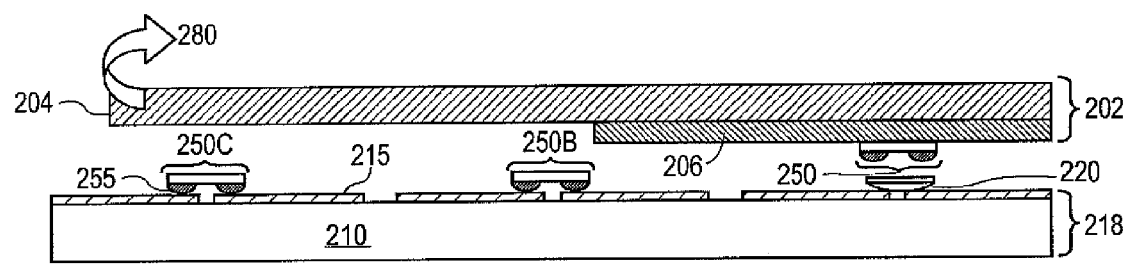
FIGS. 2A-2B depict an exemplary "bump side down" and a "bump side up" orientation of die prior to drop on a subsequent substrate, respectively, at various stages according to the method depicted in FIG. 1 in accordance with the present teachings.
Figure 2B:
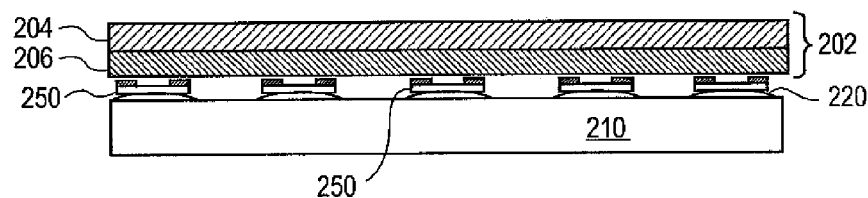

Specifically, FIG. 1 depicts an exemplary method 100 for assembling IC chips onto a chip substrate using either of a "bump side down" or "bump side up" assembly, while FIGS. 2A-2B depict the exemplary orientations on an intermediate transfer layer with respect to an exemplary subsequent layer, and FIGS. 3A-3B and FIGS. 4A-4G depict exemplary processes at various stages of the method 100 depicted in FIG. 1 in accordance with the present teachings. Although the method 100 will be described with reference to the remaining figures for illustrative purposes, the process of method 100 is not limited to the structures shown in those figures.

The method 100 begins at 110 in FIG. 1. At 120, IC elements can be initially bonded to a functional surface of a release member. The release member can be an initial chip supply or an intermediate transfer layer.

At 130, the chip substrate can be selectively prepared with a surface treatment. The chip substrate can be any subsequent surface including an intermediate transfer layer or a final chip substrate. The surface treatment can include, for example, selectively applying (e.g., depositing or coating) an activatable thermal barrier material on surface of a chip substrate for preparing one or more portions of the chip substrate. In various embodiments, the activatable thermal barrier material can be selectively applied on a common chip substrate to selectively prepare multiple portions of the common chip substrate.

In various embodiments, the activatable thermal barrier material can be selectively applied onto the chip substrate using a printing process. As used herein, the term "print" includes its ordinary meaning recognized in the art. For example, a printing process can be used to produce arbitrary patterns of material dots, such as patterned activatable thermal barrier material, with or without an array of printing studs on a receiving surface, for example, on a surface of an intermediate transfer layer or a chip substrate. The printing process can provide high throughput and provide selectivity of the geometry and distribution of the printed materials.

At 140, one or more IC elements that are attached to the release layer can be positioned closely adjacent to the chip substrate such that each IC element contacts a corresponding prepared, portion of the intermediate transfer layer or chip substrate. Therefore, the one or more IC elements can have a first surface attached to the release layer and have a second surface contacted with the prepared chip substrate. A "transfer" of the IC elements from the release layer to the prepared chip substrate can occur upon removal of the release layer. Such removal can take place either prior or subsequent to either of the following steps of applying thermal energy and bonding.

At 150, the IC elements can be assembled on the chip substrate by applying thermal energy to the activatable thermal barrier layer and thereby bonding each IC element to the corresponding prepared portion of the chip substrate. For example, various energies can be applied to activate the activatable thermal barrier material and generate thermal energy to induce the adhesive state of the thermal barrier material such that a deposited chip will adhere thereto.

In various embodiments utilizing a plastic substrate, heat generated within the activated thermal barrier material can soften a contacted portion of the plastic substrate and a suitable compressive pressure can be applied onto the release layer attached to the first surface of the IC elements to push the IC elements into the softened portions of the intermediate transfer layer or chip substrate. In various embodiments, the embedded IC elements using the activatable thermal barrier material can be flush with the surface of the chip substrate or below the surface of the chip substrate.

In various embodiments, prior to the transferring, the chip substrate can be prepared for either a "bump side down" assembly of the IC elements or a "bump side up" assembly of the IC elements. The chip substrate can be prepared by, for example, printing the supporting electronics thereon. The printed supporting electronics can be determined based on particular applications, for example, antennas can be printed on the chip substrate for an RFID device. The transferring of IC elements from the release layer to the substrate can be either prior or subsequent to bonding of the IC chips with the substrate. Accordingly, either prior or subsequent to the transfer, a sufficient thermal energy can be applied to the thermal barrier layer at 150 to activate the thermal adhesive via the IR absorber therein. Activating the thermal adhesive can enable bonding of the IC elements with the substrate. Additionally, activating the IR absorber in the thermal barrier material can generate a sufficient heat in the barrier layer to melt (soften) an adjacent plastic or other pliable substrate.

At 160, the thermal energy source is terminated and an ambient or otherwise induced cooling occurs such that a final adhesive bond can occur between the IC chips and substrate. Also at 160, in the event of softening of the substrate due to heat generated by the thermal barrier material, the bonding can include embedding of the IC chip into the substrate in addition to adhesive bonding.

In various embodiments, the acts of releasing, preparing (including softening), transferring, and assembling of the one or more IC elements illustrated in the method 100 can be performed simultaneously in a successive manner using, for example, a sheet to sheet process or a flexible roll to roll process.

FIGS. 2A-2B illustrate an exemplary release layer including a "bump side down" orientation in FIG. 2A and a "bump side up" orientation in FIG. 2B, each relative to subsequent surface such as a final chip substrate 218 and 210, respectively. As shown in the cross sectional view of FIG. 2A, an exemplary release layer 202 is depicted having one or more IC elements 250 formed thereon in a "bump side down" on an antenna substrate 218. The exemplary antenna substrate 218 can include a plastic chip substrate 210 and a plurality of antennas 215 formed thereon. The plurality of antennas 215 can include various conductive materials such as metal, metal alloy or other known suitable material. The plurality of antennas 215 can be formed by, for example, sintering screen printed silver paste and/or sintering grauvere printed silver nanoparticles. In various embodiments, a conductive adhesive such as the activatable thermal barrier layer 220 can be disposed between the antenna 215 of the chip substrate 210 and the bump bonds 255 of each die 250B or 250C. In various embodiments, the activatable thermal barrier layer of FIG. 2A can include a conductive material therein for electrically connecting the bump bonds 250 with conductive materials of the antenna 215. In various embodiments, the barrier layer 220 can include a conductive metal coating having, for example, a plastic or dielectric overlay, the metal coating electrically connecting with the bump bonds 250.

The resulting placement of die 250 as depicted in FIG. 2A can be further processed by individually or uniformly encapsulating the released die. An exemplary description follows in connection with FIGS. 5 and 6A-6D hereinafter.

In another example, FIG. 2B depicts an exemplary release layer 202 orienting a plurality of IC elements 250 "bump side up" on a substrate 210. The exemplary substrate 210 can include any known IC substrate such as glass (e.g. Corning® 2000), metal (e.g. stainless), plastic (e.g. Penn® and polyimide), etc. The exemplary substrate 210 can be plastic or other suitable rigid or flexible substrate material. In the case of flexible substrate material 210, the substrate can be supplied sheet to sheet or roll to roll.

In each of the exemplary figures, the release layer 202 can further include a release substrate 204 having a functional surface 206 formed thereon. In one embodiment, the functional surface 206 can include a tape-adhesive surface for holding the one or more IC elements 250, followed by an easy release (e.g., detaching) from the release substrate 204. In another embodiment, the functional surface 206 can include a phase change material formed on the release substrate 204. The one or more IC elements 250 can therefore be attached to and later be released from the release layer 202 through the phase change induced by, for example, an optical energy such as a UV or IR laser as operably depicted, for example, at 370 in FIG. 3B and 470 in FIG. 4C. In each case, the release substrate 204 can include a laser transmissive release substrate so that an optical signal can be applied onto the phase change material 206 through the release substrate 204. The one or more IC die elements 250 can thus be detached from the release substrate 204 due to the phase change of the phase change material 206.

Figure 3A:
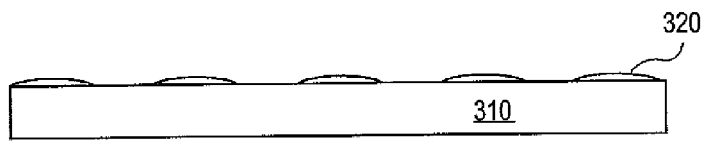
FIGS. 3A-3B depict an exemplary process at various stages according to a bump side down assembly of IC elements with a chip substrate in accordance with the present teachings.

FIGS. 3A and 38 depict an exemplary process for assembling IC chips using the thermal barrier layer to selectively prepare a chip substrate in accordance with the present teachings.

As depicted in FIG. 3A, a surface of substrate 310 is prepared by applying a surface treatment of an activatable thermal barrier material 320 thereon. As described above, the activatable thermal barrier material 320 can be selectively applied onto the chip substrate using a printing process. As used herein, the term "print" uses its ordinary meaning recognized in the art. For example, a printing process can be used to produce arbitrary patterns of material dots, such as patterned activatable thermal barrier materials, with or without an array of printing studs on a receiving surface, for example on a surface of an intermediate transfer layer or a chip substrate. The printing process can provide high throughput and provide selectively of the geometry and distribution of the printed materials. In various embodiments, the activatable thermal barrier material can be selectively applied on a common chip substrate to selectively prepare multiple portions of the common chip substrate.

Figure 3B:
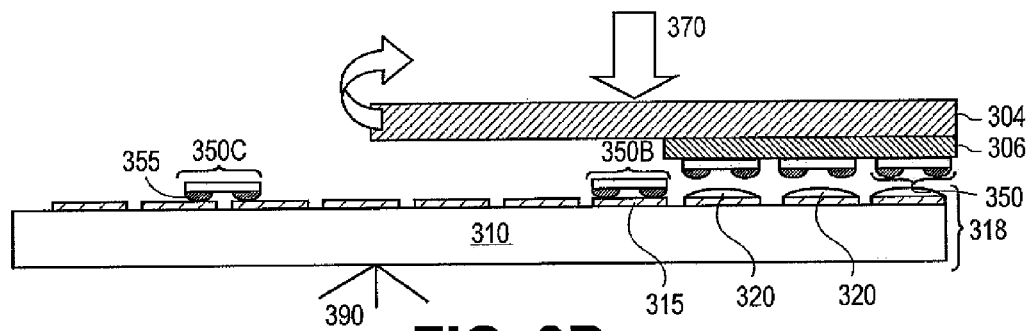

The device in FIG. 3B indicates that one or more IC elements 350 can be released from a release layer 302 and transferred onto the exemplary substrate 318. The released (i.e., detached) one or more dies 350, e.g., 350B and 350C shown in FIG. 3B, can then be transferred onto the exemplary substrate 318 having an electrically conductive contact with the substrate through a plurality of bump bonds 355 of each transferred die 350B or 350C. In various embodiments, the substrate can include surface contacts such as, for example, antenna contacts 315 such as that depicted by way of example in FIG. 2A. In various embodiments, the activatable thermal barrier layer 320 can include a conductive thermal adhesive having an IR absorber therein, with the thermal barrier layer disposed between the antenna of the chip substrate and the bump bonds of each die.

The die 350 can be released by applying phase-change incident energy such as that shown at 370. Upon releasing the die 350 in FIG. 3B, the release support 304 can be removed from over the substrate 318 to expose the released and transferred dies 350C and 350B. In this manner, a large amount of dies can be released, transferred, and bonded selectively, successively, and simultaneously.

Either prior or subsequent to release of the release support 304, various energies can be applied to activate the activatable thermal barrier material 320 to generate thermal energy to activate the IR absorber and hence the bonding function of the thermal adhesive on the chip substrate 310/318. For example the activatable thermal barrier layer 320 can be activated by applying an energy source as shown at 390.

FIGS. 4A-4G depicts an exemplary process for assembling IC chips using the activatable thermal barrier layer to selectively soften a chip substrate in accordance with the present teachings. The process depicted in FIG. 4 is performed generally according to one embodiment of the method 100 in FIG. 1. Likewise, the device in FIG. 4D indicates that one or more IC elements 450 can be released from a release layer 402 and transferred onto the exemplary substrate 410 in a "bump side up" orientation.

The surface treatment can include, for example selectively applying (e.g. depositing or coating) an activatable thermal barrier material on a surface of a plastic chip substrate for preparing one or more portions of the chip substrate. In various embodiments, the activatable thermal barrier material can be selectively applied on a common chip substrate to selectively prepare multiple portions of the common chip substrate.

In various embodiments, and as described above, the activatable thermal barrier material can be selectively applied onto the chip substrate using a printing process. As used herein, the term "print" uses its ordinary meaning recognized in the art. For example, a printing process can be used to produce arbitrary patterns of material dots, such as patterned activatable thermal barrier materials, with or without an array of printing studs on a receiving surface, for example on a surface of an intermediate transfer layer or a chip substrate. The printing process can provide high throughput and provide selectively of the geometry and distribution of the printed materials.

When the activatable thermal barrier layer is applied (e.g., printed) on an exemplary plastic chip substrate, applying energy to the activatable thermal barrier layer can generate heat which can temporarily and locally soften the plastic. When this occurs, the plastic chains can be free to move in the liquid-like and/or the liquid plastic. Other components, such as IC elements, can thus be pushed in and assembled (e.g., embedded) in the exemplary plastic.

In various embodiments, the exposure time of the activatable thermal barrier material to the exemplary plastic substrate can independently or dependently affect the softening process. For example, a relatively higher temperature exposing the chip substrate can produce a deeper softening effect, which can, in turn, require less pressure to compress the IC elements into the substrate.

Figure 4A:
FIGS. 4A-4G depict an exemplary process at various stages according to a bump side up assembly of IC elements with a chip substrate in accordance with the present teachings.

In FIG. 4A, the device 400A includes a chip substrate 410 and a plurality of activatable thermal barrier layer areas 420 selectively applied (e.g., printed) thereon. The activatable thermal barrier layer 420 can be printed by a suitable printing technique, such as an ink jet printing known to one of ordinary skill in the art and can be printed with desired arrays or patterns depending on the specific applications. When the activatable thermal barrier layer is activated to generate heat, the chip substrate 410 can become selectively softened to form one or more softened portions of the chip substrate 410. In various embodiments, the printed activatable thermal barrier layer 420 can have a setting (e.g., exposure) time on the chip substrate 410 for a desired softening effect following the heating process and prior to the subsequent process such as coupling with IC elements.

Figure 4B:
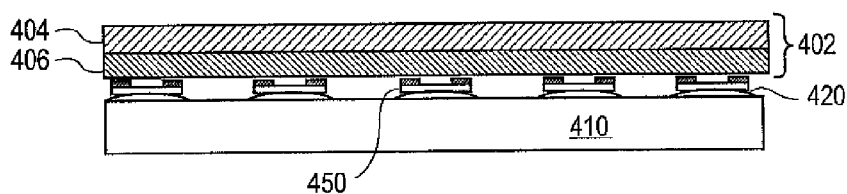

In FIG. 4B, one or more IC elements, such as, one or more RFID dies 450 that are attached to a release layer 402 can be provided for an RFID chip assembly. For example, the one or more RFID dies 450 can be positioned and contacted with the chip substrate 410 such that each RFID die 450 can contact a corresponding printed activatable thermal barrier deposit 420 or a corresponding softened portion of the chip substrate 410.

Figure 4C:
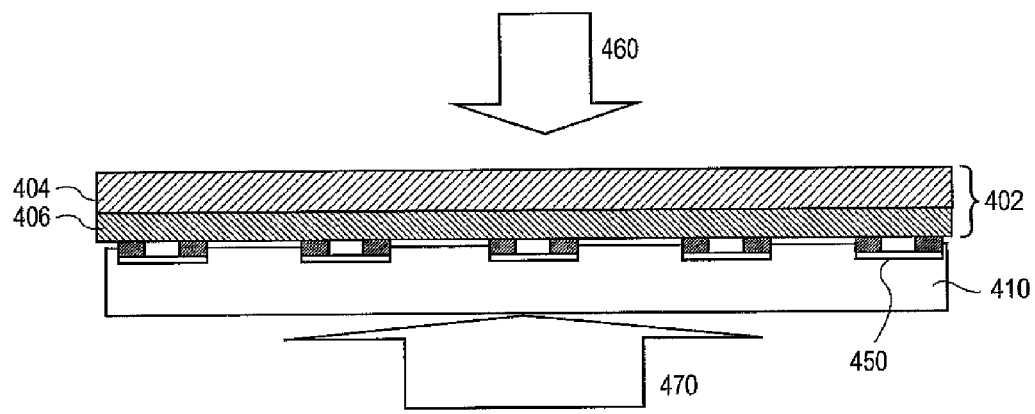

In FIG. 4C, each RFID die 450 can be embedded into the corresponding softened portion of the chip substrate 410. In an exemplary embodiment, a suitable compressive pressure can be applied at 460 on a release layer 402 to push each RFID die 450 into the corresponding softened portion. In various embodiments, the applying of the compressive pressure at 460 and the laser source at 470 (depicted in FIG. 4D) can be performed sequentially or simultaneously on each die 450. Likewise, it will be appreciated that application of heat and/or pressure can be from the same side of the chip substrate 410.

Figure 4D:
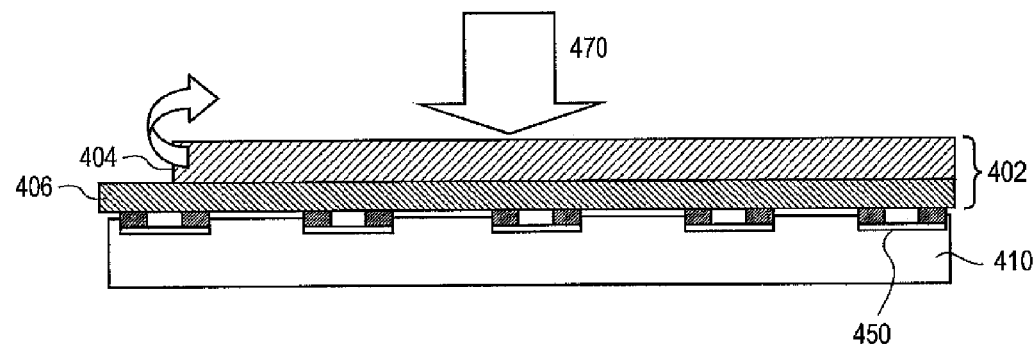
Figure 4E:
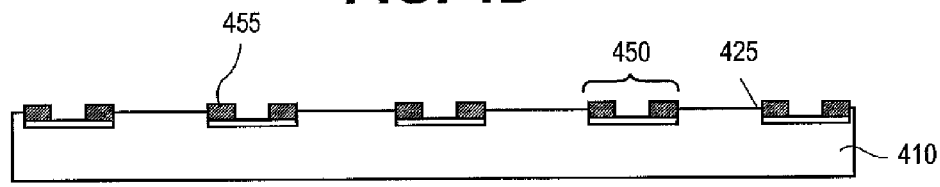

In FIG. 4D, to further complete the assembly of RFID chips, the release layer 402 can be removed depending on the material used for a functional surface 406. For example, the release layer 402 can be easily removed by detaching a tape adhesive or by optically inducing a phase change with energy source 470 when a phase change material is used for the functional surface 406. In this manner, the device can include the one or more RFID dies 450 embedded in the softened portions 425 of the chip substrate 410, for example, in a bump side up manner as depicted in FIG. 4E.

Figure 4F:
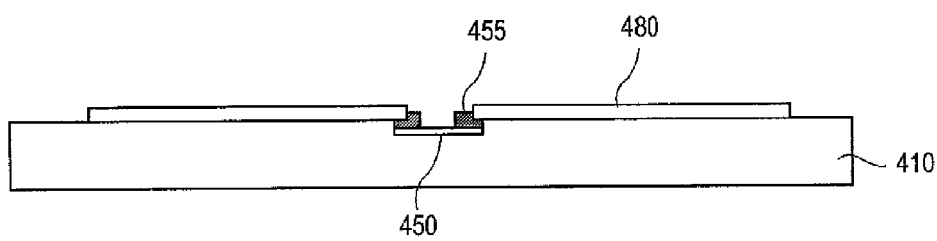

In FIG. 4F, supporting electronics, such as antennas 480, can be printed on the embedded RFID dies 450. The antennas 480 can include various conductive materials such as metal, metal alloy or other known suitable conductive materials. The antennas 480 can be formed by, for example, sintering screen printed silver paste and/or sintering grauvere printed silver nanoparticles. The antennas 480 can have an electrical contact with a plurality of bump bonds 455 of each RFID die 450.

Figure 4G:
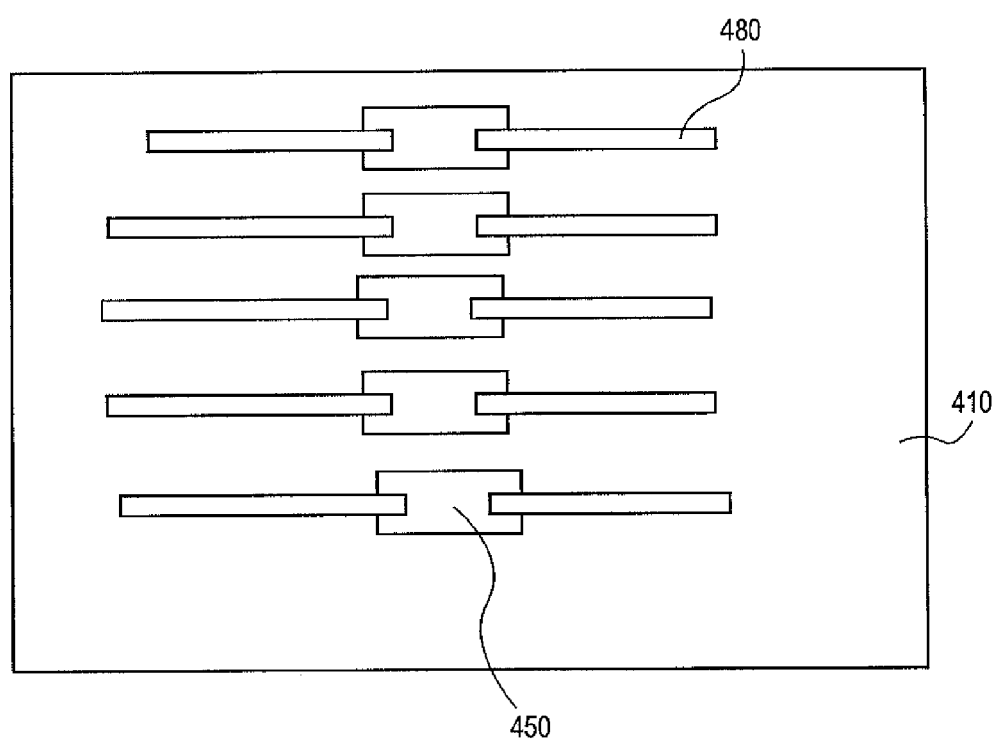

In FIG. 4G, a top view of the assembled RFID chip is shown. The antennas 480 can have an electrical contact with the embedded RFID dies 450 through each bump bond.

Thus, the method 100 can conclude at 170 having the one or more IC die elements bonded on and/or embedded in an intermediate transfer layer or the chip substrate in either a "bump side up" or "bump side down" orientation. In various embodiments, the acts of releasably bonding, releasing, transferring, and bonding of the one or more IC elements illustrated in the method 100 can be performed simultaneously in a successive manner using, for example, a sheet to sheet process or a flexible roll to roll process.

As used herein unless otherwise specified, the terms "soften" and "softening" refer to a molecular chain progression of a solid material, for example, at any transitional stages/points from a solid state into a liquid-like or liquid state (e.g., fusion or ablation). The softening can further include a gradual decrease in viscosity for an amorphous substance or a melting of a crystalline solid. The softening process can be conducted, for example, by applying a sufficient thermal energy to an activatable thermal barrier material deposited on a plastic substrate. Heat generated within the activatable thermal barrier material will soften the plastic by an amount sufficient to embed an IC chip therein.

In each of the exemplary embodiments of FIGS. 3 and 4, a number of IC elements that are attached to a release layer can be selectively or locally placed on the chip substrate, wherein each IC element contacts a corresponding prepared portion of the chip substrate. In various embodiments, such as that of FIG. 4, pressure or heat can be applied to facilitate the embedment of each IC element into the corresponding softened prepared portion. As shown, the processes in FIG. 3 and FIG. 4 can be repeated as desired to control the geometry and distribution of the assembly of the IC elements on the chip substrate.

It is noted that the disclosed methods and processes shown in FIGS. 1-4 can be "controllable" for selectively releasing, transferring, and/or assembling IC elements. For example, by controlling a pattern area of the activatable thermal barrier material and thus the adhesive bonding or softened area of the chip substrate, one or more selected IC elements or multiple IC elements can be assembled at the same time. In addition, the geometry and distribution of the released IC elements can be spatially controlled during the assembly.

It is also noted that the disclosed methods and processes shown in FIGS. 1-4 can be "controllable" for selectively screening (inspecting), and/or repairing during the assembling of the IC elements. For example, a group of the one or more IC elements that are attached to a release layer can be selected for an inspection using a suitable test circuitry. The inspected IC element that needs to be repaired can then be determined and selectively released from the release layer and selectively transferred and assembled to the chip substrate using the disclosed methods and processes for a subsequent individual or group repair.

In various embodiments, the resulting placement of die 250 as depicted in FIG. 2A can be further processed by individually or uniformly encapsulating the released die. An exemplary description is as follows in connection with FIGS. 5 and 6A-6D. It will be appreciated that encapsulation, however, can be employed for each of the exemplary embodiments herein and the following description is not intended to be limited to the embodiment shown.

Figure 5:
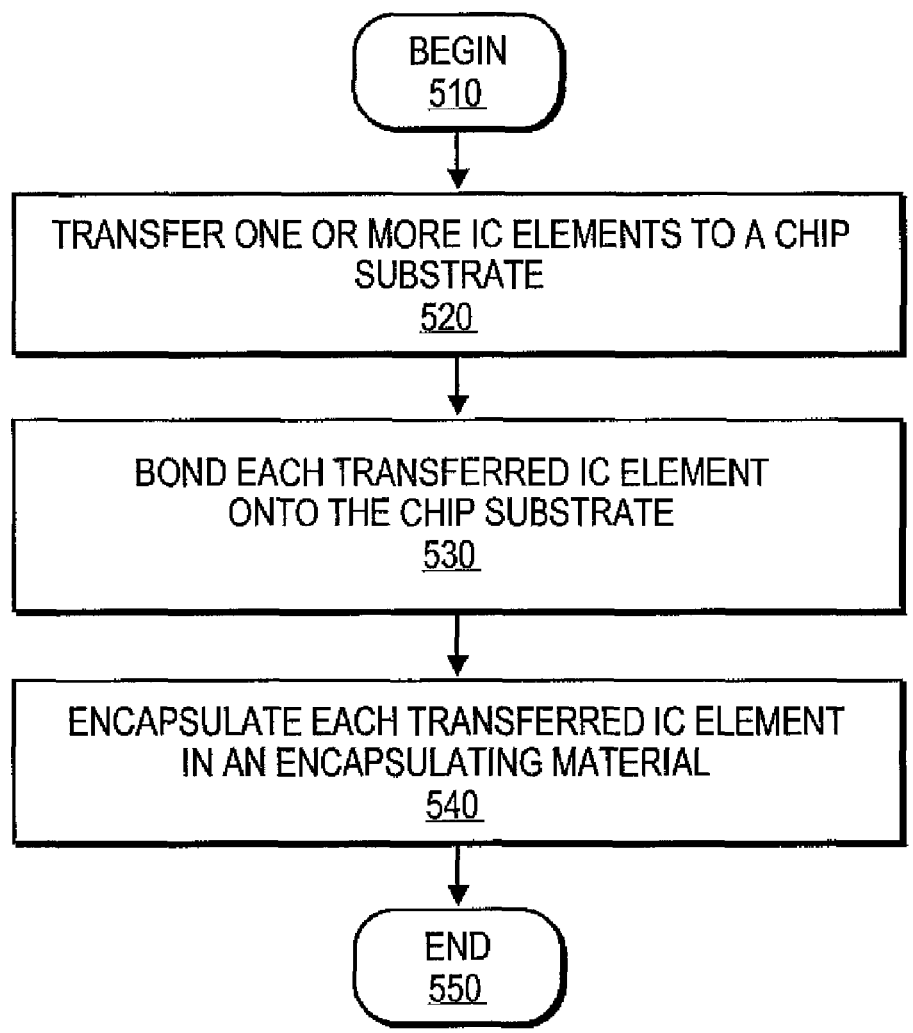
FIG. 5 depicts an exemplary method for a "bump side down" assembly of IC elements onto a chip substrate and including encapsulation in accordance with the present teachings.

FIG. 5 depicts an exemplary method for a "bump side down" assembly of IC elements onto a chip substrate with subsequent encapsulation in accordance with the present teachings.

FIGS. 6A-6D depict an exemplary process at various stages according to the method depicted in FIG. 5 in accordance with the present teachings.

As disclosed herein, the assembly of IC elements (e.g., the dies for RFID chips) can include releasing the IC elements from a release layer, transferring them onto a receiving surface (e.g., a chip substrate surface) and accommodating (e.g., encapsulating) them with the receiving surface.

Specifically, FIG. 5 depicts an exemplary method 500 for assembling IC chips onto a chip substrate using an encapsulating material for a "bump side down" assembly, while FIGS. 6A-6D depict an exemplary process at various stages of the method 500 depicted in FIG. 5 in accordance with the present teachings. Although the method 500 will be described with reference to FIGS. 6A-6D for illustrative purposes, the process of method 500 is not limited to the structures shown in FIGS. 6A-6D.

The method 500 begins at 510 in FIG. 5. At 520, the IC elements can be released from a release layer and then be transferred onto a chip substrate. In various embodiments, prior to the transferring, the chip substrate can be prepared for a "bump side down" assembly of the IC elements. The chip substrate can be prepared by, for example, printing the supporting electronics thereon. The printed supporting electronics can be determined based on particular applications, for example, antennas can be printed on the chip substrate for an RFID device.

Figure 6A:
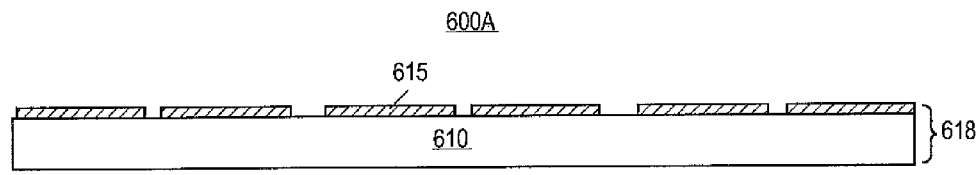
FIGS. 6A-6D depict an exemplary process at various stages of encapsulation according to the method depicted in FIG. 5 in accordance with the present teachings.
Figure 6B:
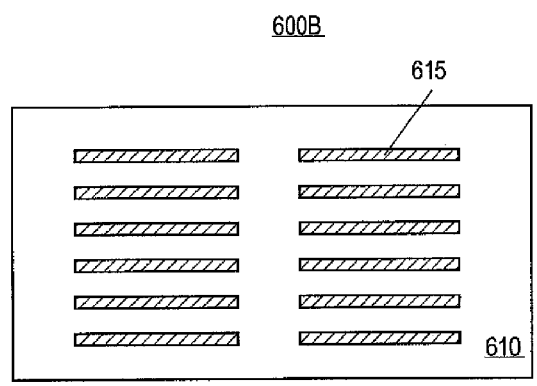

For example, FIGS. 6A-6D illustrate an exemplary prepared chip substrate 600A/B. As shown in the cross sectional view of FIG. 6A, an exemplary antenna substrate 618 (see 600A) can include a plastic chip substrate 610 and a plurality of antennas 615 formed thereon. FIG. 6B shows a top view of the exemplary antenna substrate 618 (see 600B). The plurality of antennas 615 can include various conductive materials such as metal, metal alloy or other known suitable material. The plurality of antennas 615 can be formed by, for example, sintering screen printed silver paste and/or sintering grauvere printed silver nanoparticles.

Figure 6C:
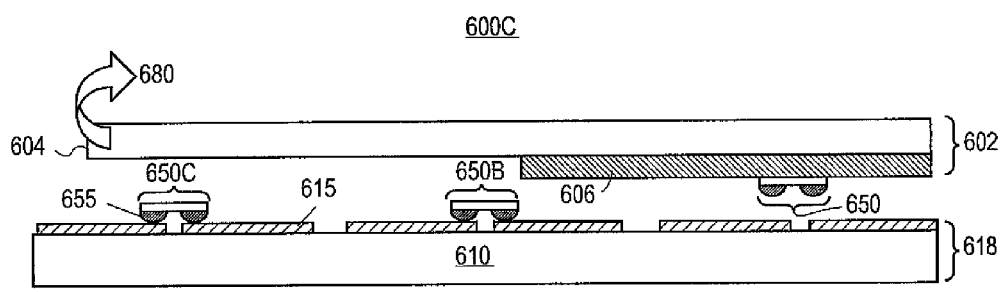

The device 600C in FIG. 6C indicates that one or more IC elements 650 can be released from a release layer 602 and transferred onto the exemplary antenna substrate 618 (see 600A and/or 600B). The release layer 602 can further include a release substrate 604 having a functional surface 606 formed thereon. In one embodiment, the functional surface 606 can include a tape-adhesive surface for holding the one or more IC elements 650, followed by an easy release (e.g., detaching) from the release substrate 604. In another embodiment, the functional surface 606 can be a phase change material formed on the release substrate 604. The one or more elements 650 can therefore be attached to and later be released from the release layer 602 through the phase change induced by, for example, an optical energy such as a UV or IR laser (not shown). In this case, the release substrate 604 can be a laser transmissive release substrate so that an optical signal can be applied onto the phase change material 606 through the release substrate 604. The one or more IC die elements 650 can thus be detached from the release substrate 604 due to the phase change.

The released (i.e., detached) one or more dies 650, e.g., 650B and 650C shown in FIG. 6C, can then be transferred onto the antenna substrate 618 having an electrically conductive contact with the plurality of antennas 615 through a plurality of bump bonds 655 of each transferred die 650B or 650C. In various embodiments, a conductive adhesive or an activatable thermal barrier layer can be disposed between the antenna 615 of the chip substrate 610 and the bump bonds 655 of each die 650B or 650C.

At 530 in FIG. 5, the transferred IC elements can further be bonded with the exemplary antenna substrate by, for example, applying a pressure, a heat and/or a combination thereof.

Figure 6D:
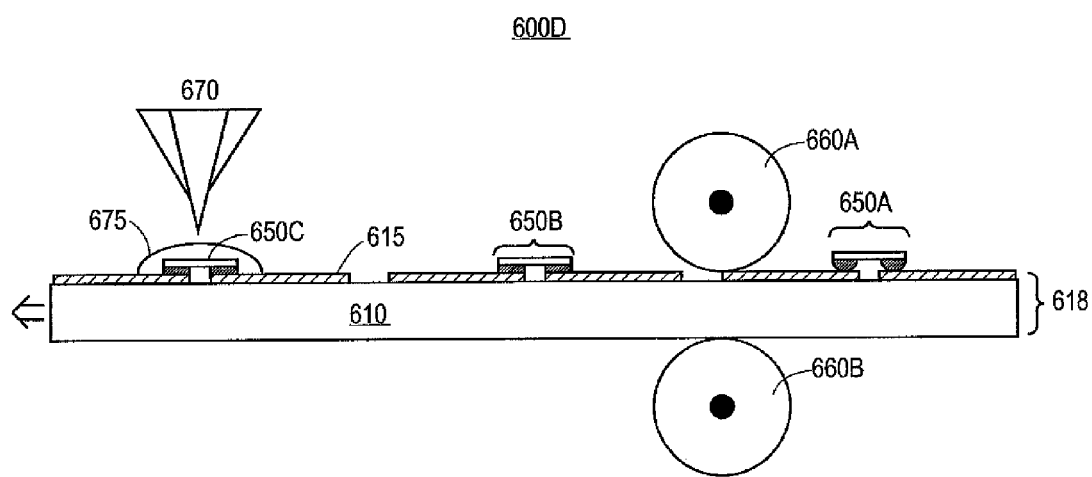

For example, as shown in FIG. 6D, the transferred dies can be bonded with the antenna substrate 618 by using various application rollers 660 A/B to form bonded dies (e.g., 650B or 650C) on the antenna substrate 618.

In one embodiment, at least one pressure roller such as 660A can be used to apply pressure to each transferred die 650 to provide a compressive pressure for bonding the bump bonds 655 of the die 650 with the underlying antenna substrate 618. In various embodiments, more pressure rollers can be used. For example, a second pressure roller, feed, or idler roller 660B can oppose the roller 660A and be positioned on an opposite side of the chip substrate 610 to assist in bonding each die (e.g., 650 B/C) with the antenna substrate 618.

In another embodiment, at least one heating roller 660A can be used to roll over each transferred die 650 to provide a thermal energy for bonding each transferred die with the underlying antenna substrate 618. In various embodiments, more heating rollers can be used. For example, a second heating roller, feed, or idler roller 660B can oppose the roller 660A and be positioned on an opposite side of the chip substrate 610 to assist in bonding each die (e.g., 650 B/C) with the antenna substrate 618.

In an additional embodiment, each transferred die 650 can be bonded with the underlying antenna substrate 618 by applying both a compressive pressure and thermal energy using one or more of an exemplary roller 660A and an exemplary roller 660B. In addition, the compressive pressure and the heat can be applied by, for example, one or more pressure rollers and one or more heating rollers. In the event of multiple rollers formed in series, pressure and heat can then be applied either sequentially or simultaneously according to a positioning of rollers.

At 540 in FIG. 5, the bonded IC elements on the antenna substrate can be encapsulated in place using an encapsulating material, which can be a curable material including, but not limited to, polyurethane, polyethylene, polypropylene, polystyrene, polyester, and epoxy, and combinations thereof. The encapsulating material can be generally deposited over electronic components (e.g., dies 650B or 650C in FIG. 6D) mounted on a chip substrate (e.g., the antenna substrate 618) using, for example, a syringe-type dispenser moved over the chip substrate. For example, dams (e.g., 675 in FIG. 6D) of high viscosity encapsulating material 670 can be first deposited around areas where components are bonded and then the areas within the dams can be cured by, for example, applying pressure, heat or radiation depending on the chosen encapsulating material. As still shown in FIG. 6D, the exemplary bonded die 650C can be locked in place on the antenna substrate 618 within the cured encapsulating material 675.

In various embodiments, the acts of releasing, transferring, bonding, and encapsulating of the one or more IC elements illustrated in the method 500 can be performed simultaneously in a successive manner using, for example, a flexible sheet to sheet process or flexible roll to roll process. Upon releasing the die 650 in FIG. 6C, the release support 604 can be removed at 680 from over the antenna substrate 618 to expose the released and transferred dies 650C and 650B, which can then be subjected to the application roller 660A or 660B rolling over the transferred dies 650C and 650B (see FIG. 6D) for a bonding, followed by depositing the encapsulating material 670 to cover the bonded die (e.g., 650C in FIG. 6D). In this manner, a large amount of dies can be released, transferred, bonded and encapsulated selectively, successively, and simultaneously.

Note that the exemplary dies 650A, 650B, and 650C shown in FIG. 6D illustrate die status at various stages of the assembly of IC elements based on the method 500 of FIG. 5. For example, the die 650A illustrates an exemplary transferred die at 520 of the method 500; the die 650B illustrates an exemplary bonded die at 530 of the method 500; and the die 650C illustrates an exemplary encapsulated die at 540 of the method 500. The method 500 can conclude at 540 having the one or more encapsulated IC die elements on the chip substrate.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for assembling integrated circuits comprising:
providing a chip substrate for supporting one or more IC elements on the chip substrate;
providing an activatable thermal barrier layer on the chip substrate;
transferring one or more IC elements to the chip substrate, wherein the activatable thermal barrier material is provided between the one or more transferred IC elements and the chip substrate;
bonding each transferred IC element onto the chip substrate, wherein bonding each transferred IC element comprises activating the thermal barrier layer by applying an energy source to heat and activate the bonding function of the activatable thermal barrier layer to bond each transferred IC element onto the chip substrate;
wherein the chip substrate comprises plastic; and
wherein activating the thermal barrier material further comprises softening the plastic substrate in an amount sufficient to embed the IC chip therein.

2. The method of claim 1, further comprising embedding the IC chip to have a surface flush with a surface of the plastic substrate.

3. The method of claim 1, further comprising embedding the IC chip to a predetermined depth within a surface of the plastic substrate.

4. The method of claim 1, wherein bonding further comprises applying pressure to embed each transferred IC element into the plastic chip substrate.

5. A method for assembling integrated circuits comprising:
selectively applying an activatable thermal barrier material on a chip substrate, the activatable thermal barrier material comprising an IR absorber;
applying a thermal energy to the activatable thermal barrier material and thereby soften underlying portions of the chip substrate;
positioning one or more IC elements that are attached to a release layer with respect to the chip substrate such that each IC element contacts a corresponding softened portion of the chip substrate;
applying pressure to embed each IC element into the corresponding softened portion of the chip substrate; and
removing the release layer.

* * * * *